Dec. 24, 1968

R. H. LEGATTI 3,418,554

TRANSISTORIZED GATING CIRCUIT FOR HIGH VOLTAGE CONTROLLED RECTIFIERS

Filed Oct. 23, 1965

INVENTOR.
RAYMOND H. LEGATTI

BY

Moses, McGlew & Toren
ATTORNEYS.

United States Patent Office 3,418,554
Patented Dec. 24, 1968

3,418,554
TRANSISTORIZED GATING CIRCUIT FOR HIGH VOLTAGE CONTROLLED RECTIFIERS
Raymond H. Legatti, Moultrie, Ga., assignor to Electromagnetic Industries, Inc., Sayville, N.Y.
Filed Oct. 23, 1965, Ser. No. 503,174
13 Claims. (Cl. 321—5)

ABSTRACT OF THE DISCLOSURE

A transistorized gating circuit for a high voltage SCR includes a low voltage transistor having its emitter-collector circuit connected between the gate and the anode of the SCR. The transistor, when not conducting, is thus subjected to the full potential across the SCR, and this potential is greatly in excess of the maximum potential which the transistor can withstand. A Zener diode is connected between the anode and the cathode of the SCR and has a break down potential substantially less than the maximum potential which the transistor can withstand. The Zener diode thus acts as a closed switch when the SCR is not conducting. A capacitor is connected across the input circuit of the transistor and controls the time, during each half cycle, at which the SCR becomes conductive. The SCR and the Zener diode are poled oppositely.

This invention relates to control circuits of the type in which a controlled characteristic is modulated by the use of controlled rectifiers, such as, for example, silicon controlled rectifiers, responsive to gating or triggering signals from a control circuit. More particularly, the present invention is directed to a novel gating circuit for solid state controlled rectifiers having high operating voltages, and with the gating being effected through the medium of a transistor amplifier having a relatively low operating or working voltage limit.

Silicon controlled rectifiers act to block current flow in both directions until they are triggered by a gating signal, at which time they become fully conductive. As they operate in essentially the same manner as thyratrons, they are sometimes referred to as "solid state thyratrons." Generally, these rectifiers are referred to under the term "SCR's" and will be referred to hereinafter by that term. In instances where the control signal may have a relatively small value, it is necessary to preamplify the control signal to provide an effective gating signal for the controlled rectifier. One known expedient for effecting such preamplification is to use a magnetic amplifier responsive to the control signal. The use of a magnetic amplifier as the preamplifier has several disadvantages. In the first place, control is effected through only about 150° rather than through the full 180° of a half wave of alternating current. Another disadvantage is that magnetic amplifiers are limited as to the frequency range which they can handle. Furthermore, magnetic amplifiers introduce inductive reactance into the circuit.

In my co-pending application, Ser. No. 212,224 filed July 25, 1962, for "Transistorized Gating Circuit for Controlled Rectifiers," now Patent No. 3,258,678, issued June 28, 1966. I have shown and described a novel circuit configuration whereby a transistor amplifier may be used to control the gating current or signal to a silicon controlled rectifier or SCR. In the circuit of my co-pending application, the collector-emitter, or output, circuit of a transistor amplifier is connected, in series with a blocking diode, across the anode-gate or input circuit of the SCR. The voltage drop across the SCR, when the latter is non-conducting thus provides a potential across the output circuit of the transistor so that this output circuit will conduct when the input circuit of the transistor is forward biased.

A control signal or potential is applied across the input circuit of the transistor and, under normal conditions, has a value and polarity such that the emitter-base junction is forward biased. Consequently, and under these normal circumstances, a gating pulse will be applied to the SCR during each half wave of A.C. potential impressed across the parallel arrangement of the SCR and the emitter-collector or output circuit of the transistor. The magnitude of the control potential impressed across the input circuit of the transistor determines the point, during each half cycle, at which the SCR conducts. Once the latter conducts, it acts like a closed switch so that there is no longer any potential across the output circuit of the transistor so that there is no flow of current through the latter until the next half cycle.

In the circuit of my co-pending application, the transistors are PNP transistors whose emitters are connected to the anodes of the SCR's with the transistor collectors connected to the anodes of the associated blocking diode and the cathodes of the associated diodes being connected to the gates of the associated SCR's. A capacitor is connected across the input or emitter-base circuit of each transistor and thereby the relative phase or "time constant" of the gating current, with respect to the potential applied across the associated SCR, can be varied.

The output circuit of the transistor operates in the nature of a variable resistance. This resistance is very high when there is substantially no input signal or forward bias applied to the transistor, so that current flow through the output circuit is substantially zero and the overall circuit acts in a manner as though only the condenser is connected in series with the blocking diode in the gating circuit. However, when the transistor is conducting, under a sufficient forward bias, it acts almost like a closed switch and shorts or shunts out the condenser so that, in effect, only the diode is connected in the gating circuit of the SCR.

The control circuit of my co-pending application operates very satisfactorily in practice. Not only is it possible to obtain control over substantially the full 180° of a half cycle, as compared to control over only about 150° possible with magnetic amplifiers, but also, as the transistor has substantially no reactance, the control system can be used over substantially any frequency range within the possible limits of control ranges. However, the control circuit of my co-pending application is subject to certain limitations.

For example, it is very effective with low voltages applied to the SCR's. However, SCR's can be used with voltages of the order of 800 volts. Transistors, however, cannot be used with relatively high voltages, as the operating volt limits of the usual transistors are of the order of up to about 105 volts. This seriously limits the application of the circuit of my co-pending application with respect to higher operating voltages.

An object of the present invention is to provide a transistorized gating circuit for a silicon controlled rectifier operating at a relatively high operating potential and including at least one transistor having a relatively low working voltage limit.

Another object of the invention is to provide a transistorized gating circuit for silicon controlled rectifiers, operating at high voltages, utilizing control transistors having relatively low working voltages but in which there is substantially no limit on the overall operating voltage within the limit capable of being handled by the SCR's.

A further object of the invention is to provide a transistorized gating circuit for high voltage SCR's using low working voltage transistors and in which the transistors are clamped to Zener diodes having break-down voltages not in excess of the operating voltages of the transistors, so that the voltage across the transistor cannot exceed the break-down voltage of the Zener diodes.

Still another object of the invention is to provide a voltage regulator including high voltage SCR's controlled by gating circuits including transistorized amplifiers operating at relatively low voltages and in which the components are internally tied to the positive side of the circuit.

A further object of the invention is to provide a transistorized gating circuit for SCR's of the type mentioned and which does not have any inductive reactance and thus is useful over a wide frequency range.

Still another object of the invention is to provide a voltage regulator including high voltage SCR's having transistorized gating circuits including low operating voltage transistors and operable over a 4:1 frequency range and a 4:1 voltage range and effective, through the range from 0 load to full rated load, in regulating the output voltage.

Briefly speaking, in accordance with the invention, a voltage regulating circuit is provided including a solid state controlled rectifier such as a SCR operable at a relatively high impressed voltage. A Zener diode is connected across said rectifier and an NPN transistor has its output circuit connected, in parallel with the anode, the gate and the Zener diode across a source of relatively high potential applied across said SCR.

The Zener diode has a break-down voltage not in excess of the operating voltage limit of the transistor, so that the transistor is clamped to the Zener diode whereby the voltage across the transistor cannot exceed the break-down voltage of the Zener diode. More specifically, the emitter of an NPN transistor is connected to the gate of the SCR, and the collector is connected to the cathode of the Zener diode. A D.C. control bias is provided between the emitter and the base of the transistor and a condenser is connected in parallel with the emitter-base or input circuit of the transistor.

For an understanding of the principles of the invention, reference is made to the following description of typical embodiments thereof as illustrated in the accompanying drawings.

Figure 1:
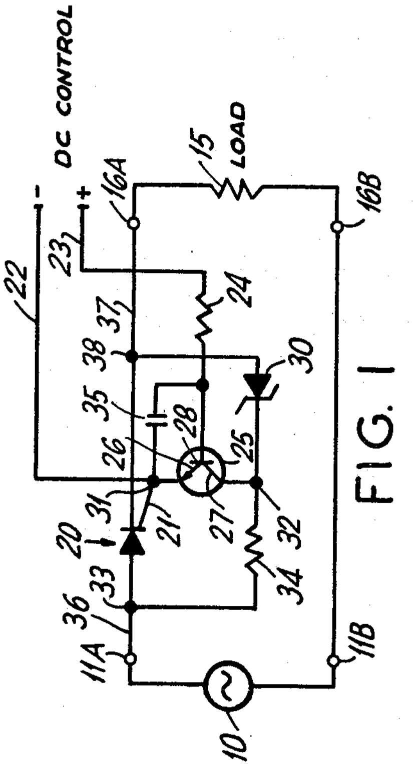
FIG. 1 is a schematic wiring diagram of a low voltage transistorized gating circuit for a high voltage SCR controlling the current flow through a D.C. load.

FIG. 1 illustrates the basic circuit of the invention. As illustrated, the basic circuit is used to control the supply of a D.C. potential from an A.C. source 10 to a load represented at 15. For example, the illustrated circuit may be an A.C. generator voltage control circuit in which the field excitation is supplied from the armature output and is modulated to maintain the armature output voltage at a preset value. A.C. source 10, which may be the armature of an A.C. generator, has output terminals 11A and 11B. These terminals are connected, respectively, to load terminals 16A and 16B, and an SCR 20 is connected in series between output terminal 11A and load terminal 16A to control the flow of current supplied to the load from source 10. The time interval during which the current flows is determined by the value of the differential control signal which may be, for example, a function of the output voltage of armature 10. In turn, the time interval during which current flows through SCR 20 is determined by the time, during each half cycle, that an effective potential is applied to the gate 21 of SCR 20.

In accordance with the invention, the gating of SCR 20 is controlled by a transistor 25 which is of the NPN type having an emitter 26, a collector 27 and a base 28. For this purpose, emitter 26 is connected to gate 21 at a junction point 31, and collector 27 is connected to a junction point 32. A resistor 34 is connected between junction point 32 and a junction point 33 in a conductor 36 connecting terminal 11A to the anode of SCR 20. Junction point 32 is also connected, through a Zener diode 30, to a junction point 38 in a conductor 37 connecting the cathode of SCR 20 to load terminal 16A.

It will be noted that Zener diode 30 is oppositely poled with respect to SCR 20, and is connected, in series with resistor 34, in a circuit which is parallel to or shunts SCR 20. As explained in my above-mentioned co-pending application, a condenser 35 is connected between the emitter 26 and base 28 of transistor 25. A forward bias is aplied to transistor 25 by a D.C. control circuit including conductors 22 and 23 and a base resistor 24.

SCR 20 may have a relatively high operating potential such as, for example, an operating potential of the order of as high as 800 volts. On the other hand, a transistor, such as transistor 25, is limited to an operating voltage of the order of 105 volts. Zener diode 30 has a break-down voltage of 6 volts. The importance of these voltage or potential relations will be apparent as the description proceeds.

Figure 2:
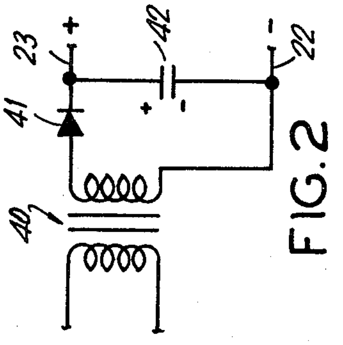
FIG. 2 is a partial schematic wiring diagram illustrating the bias supply for the circuits of FIGS. 1 and 3.

The D.C. control signal may be derived in any desired manner. For example, it may be derived as shown in FIG. 2. Referring to FIG. 2, a transformer 40 may have its primary winding connected across the A.C. source 10, for example. A diode 41 is connected to one terminal of the secondary winding of transformer 40 and a condenser 42 is connected across the secondary winding to smooth out ripples and the like.

For the purposes of explaining the operation of the invention, it will be assumed that the load 15 is the field winding of an A.C. generator whose armature is indicated at 10, and the excitation of the field winding is to be controlled in such a manner as to maintain the output voltage of armature 10 at a preselected value. Under these conditions, and with the desired output voltage set by means of a potentiometer or the like connected in series with the field winding 15, a forward bias is applied to transistor 25, through control circuit 22–23, in accordance with the output voltage of armature 10. The voltage drop across SCR 20, and particularly the voltage drop between its anode and its gate, provides the operating potential across the emitter-collector circuit of transistor 30. When there is no forward bias on the emiter-base circuit of the transistor 20, the latter acts like an open switch with substantially no current flow therethrough so that, in effect the gating circuit of SCR 20 has only condenser 35 connected therein. However, once a sufficient forward bias is applied to the emitter-base circuit of transistor 25, the emitter-collector circuit becomes fully conductive so that the transistor 25 acts like a closed switch shorting condenser 35 to provide a gating signal to SCR 20.

When SCR 20 conducts, it also acts like a closed switch across the emitter-collector circuit of transistor 25 so that there is no longer any potential drop across the emitter-collector circuit and conduction of transistor 25 ceases. Under normal operation, the several constants are so adjusted that there is sufficient forward bias upon the emitter-base circuit of transistor 25 that SCR 20 will be triggered or gated conductive for a sufficient portion of each half cycle so that the excitation of field or load 15 will be of a value such as to produce a predetermined output voltage at armature terminals 11A and 11B. Should the armature voltage at its terminals exceed the predetermined value, the value of the control signal applied to conductors 22 and 23 will be such that the forward bias of the emitter-base circuit of transistor 25 will be reduced so that the gating signal is applied at a later point during each half cycle of potential applied to SCR 20. Thereby, the average current flow through field winding or load 15 will be reduced so as to reduce the armature output voltage to its predetermined value.

The converse will take place upon a decrease in the output voltage of armature 10, as measured across terminals 11A and 11B. When this occurs, the forward bias applied to transistor 25 is increased so that the latter becomes conductive in its emitter-collector circuit at an earlier time during each half cycle so that the associated SCR is gated to a conductive state at an earlier portion of each half cycle. Thereby, the excitation of the field winding 15 is increased to an extent sufficient to restore the voltage of armature 10 to its predetermined value.

With the half wave rectifier circuit illustrated in FIG. 1, SCR 20 will become conductive, in any event, only during each positive half wave of voltage from armature 10. When the SCR is conductive, it acts like a short circuit across the emitter-collector circuit of transistor 25. However, during the succeeding half cycle, the entire voltage of armature 10, which may be as high as 800 volts, for example, is applied across the transistor 25 as SCR 20 is non-conductive, and this potential very greatly exceeds the operating voltage of transistor 25. However, the transistor is not subjected to this high voltage due to the circuit including Zener diode 30 and resistance 34. As soon as the succeeding half wave, or negative half wave, of voltage from armature 10 exceeds a value equal to the 6 volt drop across Zener diode 30 plus the drop across resistor 34, Zener diode 30 breaks down and conducts. This acts as a short circuit across transistor 25, so that the high potential is effectively shunted from transistor 25.

In effect, transistor 25 is clamped to Zener diode 30. The voltage drop across transistor 25 can never exceed the break down voltage of Zener diode 30. Consequently, with the circuit configuration illustrated, a low operating voltage transistor, such as transistor 25, can be used to control a high operating potential SCR 20 without there being any danger of damage to transistor 25 due to an overvoltage being impressed thereon.

Figure 3:
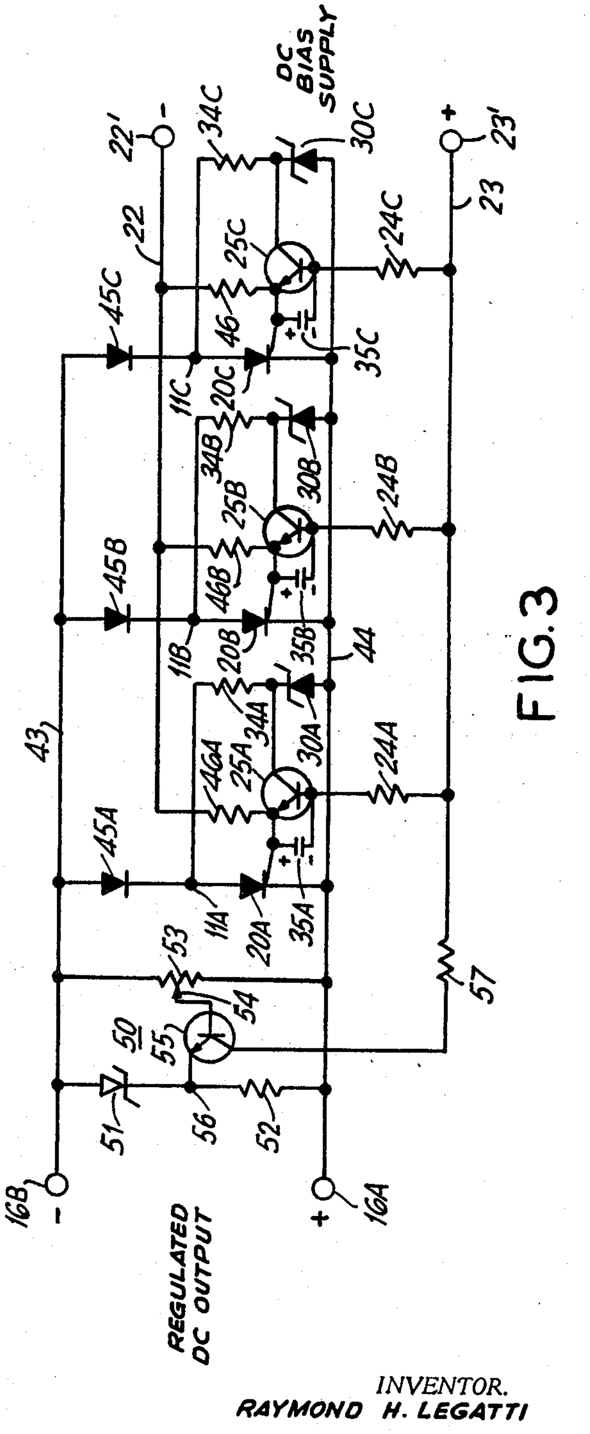
FIG. 3 is a schematic wiring diagram illustrating the principles of the invention as applied to a 3-phase full wave, 3-wire input D.C. power supply.

A most important application of the invention is that of a 3-phase full wave D.C. power supply, having a 3-phase, 3-wire input. Such an arrangement is shown in FIG. 3 wherein parts identical to those in FIG. 1 have been given the same reference character. In FIG. 3, the three phases of the A.C. supply are connected to the terminals 11A, 11B and 11C, respectively. A regulated D.C. autput is derived at the terminals 16A and 16B, connected to the negative conductor 43 and the positive conductor 44, respectively. A D.C. bias is applied to the terminals 22' and 23' connected to the conductors 22 and 23, respectively.

Each of the phases has associated therewith a control circuit of the same type as shown in FIG. 1. Also, each phase has therein an SCR 20A, 20B, or 20C, connected, in series with diodes 45A, 45B and 45C, respectively, between conductors 43 and 44. The negative side of the D.C. bias potential is applied to the emitters of the transistors 25A, 25B and 25C through emitter-resistances 46A, 46B and 46C. The positive side of the D.C. bias supply is connected to the bases of the several transistors through isolating resistors 24A, 24B and 24C. The interconnections of the SCR's 20, transistors 25, Zener diodes 30 and condensers 35 are the same as in FIG. 1.

A detector circuit, in the form of a reference bridge 50, is provided to sense the D.C. output voltage and to provide full control over each half cycle of A.C. input. Bridge 50 includes a Zener diode 51 and a resistance 52 connected in series between conductors 43 and 44, a potentiometer 53 connected between these two conductors and having an adjustable tap 54, and an NPN transistor 55 having its base connected to tap 54, its emitter connected to the junction point 56 of Zener diode 51 and resistor 52 and its collector connected, through a resistor 57, to the isolating resistors 24A, 24B, 24C.

The desired output potential across terminals 16A and 16B is selected by adjustment of tap 54 of potentiometer 53. When the actual output potential across terminals 16A and 16B is equal to the desired output potential, no bias is applied to transistor 55. However, when the actual output potential differs from the desired output potential, transistor 55 has a forward bias supplied thereto and becomes conductive. In accordance with the direction of the variation, the potential of tap 54 is applied either in adding relation or in substracting relation with the potential of D.C. bias supply conductor 23. This will either increase or decrease the forward bias applied to transistors 25A, 25B and 25C to, in turn, set the point during each half wave at which the associated SCR 20A, 20B or 20C is gated conductive. Thus, the output voltage across terminals 16A and 16B is maintained always at the regulated value and over the full half wave of each A.C. wave.

It should be noted that transistor 55 ties the bases of transistors 25A, 25B and 25C to the negative bus 43. Furthermore, the use of NPN transistors allows the whole power supply to be a solid state silicon power supply. Additionally, and as distinguished from the circuit shown in my above mentioned co-pending application, the SCR's are connected in a common cathode configuration rather than in a common anode configuration. The power supply is internally tied to the plus side of the circuit, or positive bus 44, thereby providing for easy and simple disconnection.

As there is no inductive reactance in the circuit, the circuit is good over a wide, wide frequency range. The circuit of FIG. 3, for example, is usable with a frequency range of 4:1 at its input, and with an input voltage range of 4:1. It gives complete voltage regulation from zero load to full rated load. As in the arrangement of FIG. 1, the transistors 25 are clamped to the Zener diodes 30 so that the voltage across any transistor 25 can never exceed the break-down voltage of the associated Zener diode 30.

While specific embodiments of the invention have been shown and described in detail to illustrate the application of the principles of the invention, it will be understood that the invention may be embodied otherwise without departing from such principles.

What is claimed is:

1. Gating for a solid state controlled rectifier having an anode, a cathode and a control gate and operable at a relatively high impressed voltage, said gating means comprising, in combination, a transistor having its output circuit connected, in parallel with said anode and said gate, across a source of relatively high periodically varying potential having a value substantially in excess of the operating voltage of said transistor, whereby, when said rectifier is not conducting, the potential thereacross normally will appear across said transistor output circuit; means operable to apply a control potential, variable in amplitude, across the input circuit of said transistor; a capacitor connected across the input circuit of said transistor and controlling the time, during each half cycle, at which said rectifier becomes conductive; and a Zener diode connected between said anode and said cathode; and thus across said rectifier, whereby, when said rectifier is not conducting, the potential thereacross will appear across said Zener diode; said Zener diode having a breakdown voltage not in excess of the operating voltage of said transistor, whereby said transistor is clamped to said Zener diode so that the voltage across said transistor output circuit cannot exceed the break-down voltage of said Zener diode.

2. Gating means for a solid state controlled rectifier, as claimed in claim 1, in which said transistor is an NPN transistor having its emitter connected to said gate.

3. Gating means for a solid state controlled rectifier, as claimed in claim 1, in which said rectifier and said Zener diode are connected in a reverse polarity relation.

4. Gating means for a solid state controlled rectifier, as claimed in claim 2, in which the cathode of said Zener diode is connected to said collector of said transistor output circuit and the anode of said Zener diode is connected to the cathode of said rectifier.

5. Gating means for a solid state controlled rectifier as claimed in claim 1, including a resistor connected in series with said Zener diode, at a junction point, across said rectifier; said transistor output circuit including a collector connected to said junction point and an emitter connected to said gate; said junction point being connected to the cathode of said Zener diode.

6. A rectifier circuit comprising, in combination, a pair of input terminals; a pair of output terminals; a source of relatively high A.C. potential connected across said input terminal; a solid state controlled rectifier having an anode connected to one input terminal, a cathode connected to one output terminal, and a control gate; means connecting the other input terminal to the other output terminal; an NPN transistor having its emitter-collector circuit connected between said anode and said gate whereby, when said rectifier is not conducting, the potential thereacross normally will appear across said transistor emitter-collector circuit; said transistor having an operating voltage substantially less than said A.C. potential; a capacitor connected across the input circuit of said transistor and controlling the time, during each half cycle, at which said rectifier becomes conductive; a Zener diode connected between said anode and cathode and thus across said rectifier whereby, when said rectifier is not conducting, the potential thereacross will appear across said Zener diode; said Zener diode having a break-down voltage not in excess of the operating voltage of said transistor, whereby said transistor is clamped to said Zener diode so that the voltage across said transistor cannot exceed the breakdown voltage of said Zener diode; and means, including said capacitor, operable to apply a D.C. control potential, variable in amplitude, across the input circuit of said transistor to control the time, during each half cycle, at which said rectifier is gated conductive.

7. A rectifier circuit, as claimed in claim 6, in which said rectifier and said Zener diode are connected in reverse polarity relation.

8. A rectifier circuit, as claimed in claim 6, including a resistance connected, at a junction point, to the cathode of said Zener diode and in series with said Zener diode across said rectifier; the emitter of said transistor being connected to said gate and the collector of said transistor being connected to said junction point.

9. A 3-phase, 3-wire input regulated D.C. potential output power supply comprising, in combination, three input terminals, each arranged to be connected to a respective phase of a relatively high potential 3-phase A.C. source; a positive D.C. output terminal; a negative D.C. output terminal; three solid state controlled rectifiers each having an anode connected to a respective A.C. input terminal, a cathode connected to said positive D.C. output terminal, and a gate, whereby said rectifiers are connected in a common cathode configuration; three transistors each having an output circuit connected, in parallel with the anode and gate of a respective rectifier, between the respective A.C. input terminal and said positive D.C. output terminal, whereby when the associated rectifier is not conducting, the potential thereacross normally will appear across the output circuit of the transistor connected thereto; three capacitors, each connected across the input circuit of a respective transistor and controlling the time, during each half cycle, at which the associated rectifier becomes conductive; three Zener diodes, each connected between the anode and cathode of a respective rectifier and thus across the respective rectifier whereby, when the respective rectifier is not conducting, the potential thereacross will appear across the associated Zener diode; each of said Zener diodes having a break-down voltage not in excess of the operating voltage of the associated transistor, whereby each transistor is clamped to its associated Zener diode so that the voltage across the transistor cannot exceed the break-down voltage of the associated Zener diode; a D.C. bias supply for said transistors; means connecting the input circuit with said transistors in parallel across said D.C. bias supply; and a detector circuit connected between said D.C. output terminals and to the input circuits of each of said transistors; said detector circuit, responsive to the output potential deviating from a preselected value, applying a control signal to the input circuits of said transistors, in common, to control the time, during each half wave, at which the associated rectifier becomes conductive, and in a direction such as to restore the D.C. output potential to said preselected value.

10. A power supply, as claimed in claim 9, in which each Zener diode is connected in reverse polarity relation with respect to its associated rectifier.

11. A power supply, as claimed in claim 9, in which each of said transistors is an NPN transistor having an emitter-collector output circuit, the emitter being connected to the gate of the associated rectifier and the collector being connected to the cathode of the associated Zener diode.

12. A power supply circuit, as claimed in claim 11, in which said detector circuit is a reference bridge circuit including a further transistor connected across a diagonal thereof and having an electrode connected to the bases of said three first-mentioned transistors; said further transistor, when conductive, tying the bases of said three first-mentioned transistors to said negative D.C. output terminal.

13. A power supply, as claimed in claim 12, in which said further transistor is an NPN transistor having its emitter-base circuit included in said diagonal, and having its collector connected to the bases of said three first-mentioned transistors.

References Cited

UNITED STATES PATENTS

| | | | |
|---|---|---|---|
| 3,114,098 | 12/1963 | Rallo et al. | 321—18 |
| 3,241,043 | 3/1966 | Clarke | 321—11 X |
| 3,241,044 | 3/1966 | Mills | 323—22 |
| 3,259,834 | 7/1966 | Wright | 323—22 |
| 3,304,489 | 2/1967 | Brolin et al. | 323—9 |

JOHN F. COUCH, *Primary Examiner.*

G. GOLDBERG, *Assistant Examiner.*

U.S. Cl. X.R.

307—237, 252; 321—16; 322—28; 323—22